United States Patent [19]

Volpe et al.

[11] Patent Number: 4,928,208

[45] Date of Patent: May 22, 1990

[54] HOUSING AND CONNECTION DEVICE FOR ELECTRONIC MODULES

[75] Inventors: Fulvio Volpe, Arcofelice Pozzuoli; Michele Perchiazzi, Napoli, both of Italy

[73] Assignee: Selenia Industrie Elettroniche Associate S.p.A., Rome, Italy

[21] Appl. No.: 317,033

[22] PCT Filed: Jul. 24, 1985

[86] PCT No.: PCT/IT85/00021

§ 371 Date: Jun. 23, 1986

§ 102(e) Date: Jun. 23, 1986

[87] PCT Pub. No.: WO86/04207

PCT Pub. Date: Jul. 17, 1986

Related U.S. Application Data

[63] Continuation of Ser. No. 211,105, Jun. 17, 1988, abandoned, which is a continuation of Ser. No. 876,882, filed as PCT IT85/00021 on Jul. 24, 1985, published as WO86/04207 on Jul. 17, 1986 abandoned.

[30] Foreign Application Priority Data

Jan. 3, 1985 [IT] Italy ............................ 35502/85[U]

[51] Int. Cl.$^5$ ............................................ H05K 1/14
[52] U.S. Cl. .................................... 361/395; 361/380; 361/399
[58] Field of Search ............................ 361/394–395, 361/399, 415

[56] References Cited

U.S. PATENT DOCUMENTS

| | | |
|---|---|---|
| 3,729,657 | 4/1973 | Callan et al. .................... 174/52 R |
| 3,997,819 | 12/1976 | Eggert et al. .................... 361/386 |
| 4,251,853 | 2/1981 | Sites ................................ 361/394 |
| 4,546,407 | 10/1985 | Benenati ......................... 361/395 |
| 4,571,663 | 2/1986 | McPherson ..................... 361/415 |
| 4,672,511 | 6/1987 | Meusel et al. .................... 361/415 |

FOREIGN PATENT DOCUMENTS

| | | |
|---|---|---|
| 0652710 | 3/1965 | Belgium . |
| 2919394 | 11/1979 | Fed. Rep. of Germany . |
| 3148902 | 6/1983 | Fed. Rep. of Germany . |
| 2566221 | 12/1985 | France ............................ 361/415 |

OTHER PUBLICATIONS

D. L. Smith, "Flexible Multilayer Interconnection Board Fabrication", IBM Technical Disclosure Bulletin, vol. 17, No. 4, Sep. 1974, at p. 990.

Primary Examiner—Gregory D. Thompson
Attorney, Agent, or Firm—Bryan, Cave, McPheeters & McRoberts

[57] ABSTRACT

A housing and connection device for electronic modules consisting of two parts, one of which is fixed and the other of which is movable. The movable part is detachably connected to the fixed part via a hook and pivot, and screw. The inside of the movable part contains a series of parallel grooves suitable for holding one or more electronic modules, such as printed circuit boards. The modules make electrical contact with a first motherboard at the rear of the movable part. The first motherboard in turn makes electrical contact with a second motherboard in the movable part, located above the first motherboard. The movable part also has a removable, grilled cover with a lock and it has an expansion system to accommodate additional modules.

6 Claims, 2 Drawing Sheets

HOUSING AND CONNECTION DEVICE FOR ELECTRONIC MODULES

This is a continuation, of U.S. Application Ser. No. 07/211,105, filed June 17, 1988, which is a continuation of U.S. application Ser. No. 06/876,882, filed as PCT IT 85/00021 on Jul. 24, 1985, published as WO86/04207 on Jul. 17, 1986, now abandoned.

BACKGROUND OF THE INVENTION

The present invention concerns a housing and connection device which is meant to accommodate electronic modules, such as printed circuit boards. In its preferred form, it may be utilized in low frequency telephone exchange distributors. It is used in the field of telecommunications, in particular the filed of housing and connection devices for telecommunications.

Until now, electromechanical structures used for the housing and connection of electronic modules have suffered from numerous drawbacks:

they did not have upper and rear motherboards; therefore they did not provide flexibility so as to function in different configurations;

device expandibility was not possible because no expansion system was provided (for a series of vertical and/or horizontal structures);

The mechanical structure would not allow a high rate of heat dissipation through natural convection because the structures were closed;

they did not use European format modules; this limited their utility and reduced their flexibility.

SUMMARY OF THE INVENTION

The housing and connection device, which is the object of this invention, solves those and other problems. Through its novel structure, it affords numerous advantages, even over devices having different configurations, because European format (e.g., DIN 41494) is an internationally recognized standard.

Some of the advantages afforded by the present invention are set forth below:

Simplified construction process, having high reliability due to the absence of wired connections for internal connections.

Very good maintenance features because each part of the device is field-replaceable without making use of special equipment (a simple screwdriver is all that is required).

Flexibility of the mechanical structure; e.g., as applications and configurations vary, all that is needed is to equip devices with different motherboards, leaving the other parts unchanged.

Remarkable natural heat dissipation capacity per unit volume, due to its novel cover configuration.

BRIEF DESCRIPTION OF THE DRAWINGS

To facilitate further discussion of the present invention, the following drawings are provided in which.

DETAILED DESCRIPTION OF THE INVENTION

The figures may be described in further detail as follows.

Figure 1:
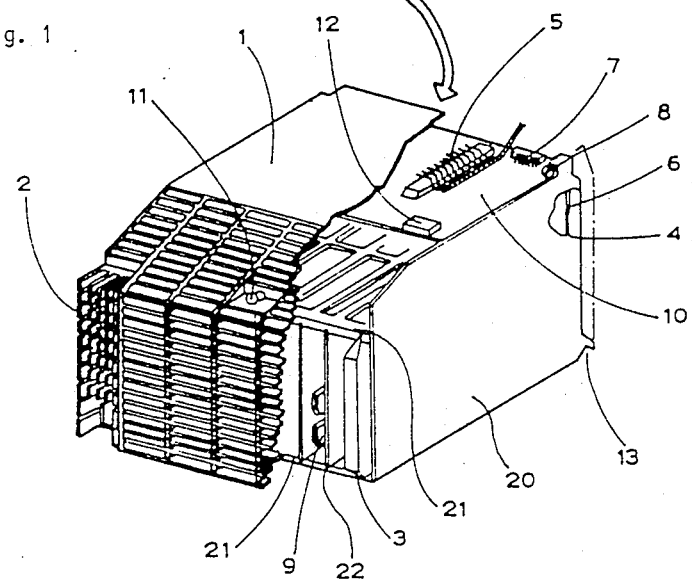
FIG. 1 shows a front perspective view of the device of this invention with the cover shown partially cutaway.

FIG. 1 shows a removeable housing member, where:
1 is an L-shaped grilled protective removeable cover;
2 is a power supply module;
3 is an expansion system;
4 is a container compartment or movable housing;
5 and 12 are interface connectors;
6 is a rear printed circuit board for module interconnection (motherboard);
7 is a connector;
8 is a captive screw;
9 is an example of a module contained in the movable housing;
10 is an upper motherboard containing interfaces;
11 is a fixing device or lock for protective cover 1;
13 is a mechanical hook-on device for engagement with pivot 16 of fixed panel 14.

Figure 2:
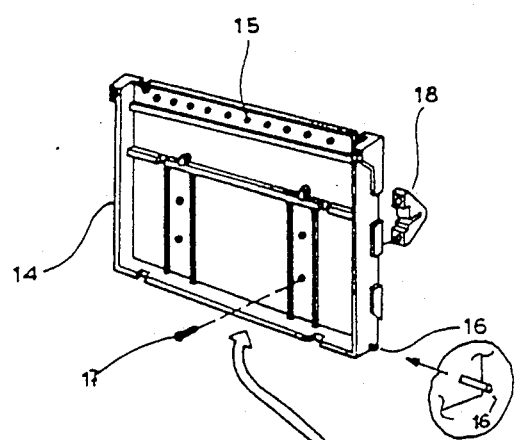
FIG. 2 shows the fixed panel assembly.

FIG. 2 shows a fixed panel assembly where:
14 is a fixed panel;
15 are openings in an area of fixed panel 14 suitable for providing an interface and power supply interconnections;
16 is a hook-up pivot for the movable housing;
17 and 18 are fixing accessories.

Figure 3:
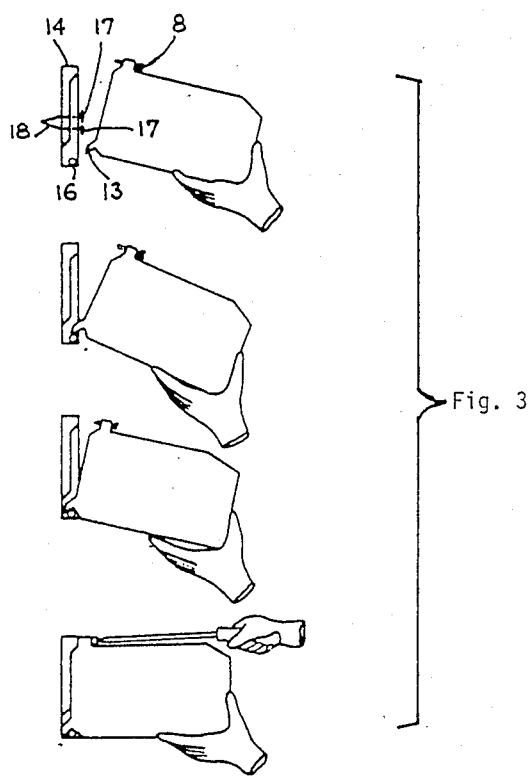
FIG. 3 shows the sequence of attaching the removeable housing to the fixed member.

FIG. 3 shows, in sequence, the hooking and fixing of the two parts (shown as FIGS. 1 and 2 in perspective).

Figure 4:
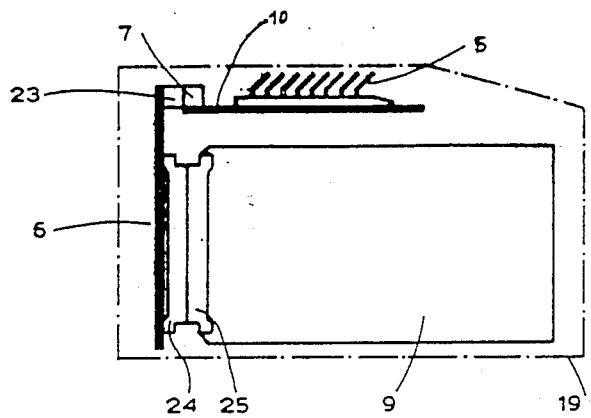
FIG. 4 shows the details of the interconnection system.

FIG. 4 shows details of the interconnection system where:
5 is the interface connector;
6 is the rear motherboard;
9 is a typical module;
10 is the upper motherboard;
19 is the compartment outline.

Referring to the drawings, the movable housing unit (FIG. 1.) consists of two sides 20 connected by cross elements 21 with grooves 22 to host electronic modules 9,2. To the rear, printed circuit board (motherboard 6) is fixed to provide module interconnection and has connectors 23 (FIG. 4) to accommodate an upper motherboard 10 for interconnection towards interface connector 5. The movable housing unit of FIG. 1 has a protective cover 1, which may be made of plastic, has an L-shaped profile, and is grilled (has openings) to permit heat dissipation. Cover 1 is also provided with a locking system which consists of a lock 11, such that upon removal of the cover 1, lock 11 remains attached to the cover. The rear fixed panel (FIG. 2) consists of a fixed panel 14 having openings 15 to accomodate loom wires, equipped with accessories 17,18 for attachment of the fixed panel 14 to the sorter frame. Mating of the two parts (FIGS. 1 and 2) takes place by virtue of a hook and pivot system 13,16 and captive screws. It should be noted that such connection is illustrated in the sequence shown in FIG. 3.

The outputs from interface moduels 25 (FIG. 4), which extend from moduels 9, are connected to the rear motherboard 6 through connectors 24. The outputs then travel through connectors 23, 7 to the upper motherboard 10, on which interface connectors 5 are mounted. Wire wrap standard connectors are located at the top of the movable housing to form an interface for connection to a plurality of other movable housing members in a horizontal and/or vertical arrangement.

We claim:

1. A housing and connection device for electronic modules comprising:
   a fixed panel member having an electrical interface area on one side thereof, and
   a movable housing member detachably mounted on the fixed panel member and having openings for heat dissipation,
   the movable housing member having a plurality of grooves extending from the interior front to the interior rear thereof for holding a plurality of electronic modules,
   the movable housing member also having a first motherboard at the rear disposed perpendicularly to said electronic modules for forming electrical connection therewith, and
   the movable housing member also having a second motherboard located above and substantially perpendicular to the first motherboard and electrically connected therewith so as to provide a housing and connection device for a plurality of electronic modules.

2. The device of claim 1 in which the movable housing member includes a L-shaped grilled removable protective cover containing a captive locking system.

3. The device of claim 2 in which the cover is made of plastic.

4. The device of claim 2 in which the fixed panel member has a pivot means and the movable housing member has a hook means on the external rear thereof and separate screw means for permitting the easy attachment and detachment of the movable housing member to and from the fixed panel member.

5. The device of claim 4 in which the movable housing member contains an external interface connector mounted thereon for providing electrical connection to other movable housing members to facilitate forming an expanded horizontal and/or vertical network of electronic modules.

6. The device of claim 1 wherein the electronic modules are in European DIN-41494 format.

* * * * *